United States Patent
Feshali

(10) Patent No.: US 11,543,589 B2
(45) Date of Patent: Jan. 3, 2023

(54) PROCESS FLOW WITH WET ETCHING FOR SMOOTH SIDEWALLS IN SILICON NITRIDE WAVEGUIDES

(71) Applicant: Anello Photonics, Inc., Santa Clara, CA (US)

(72) Inventor: Avi Feshali, Los Angeles, CA (US)

(73) Assignee: Anello Photonics, Inc., Santa Clara, CA (US)

( * ) Notice: Subject to any disclaimer, the term of this patent is extended or adjusted under 35 U.S.C. 154(b) by 0 days.

(21) Appl. No.: 17/475,250

(22) Filed: Sep. 14, 2021

(65) Prior Publication Data

US 2022/0082756 A1    Mar. 17, 2022

Related U.S. Application Data

(60) Provisional application No. 63/078,825, filed on Sep. 15, 2020.

(51) Int. Cl.
| | | |
|---|---|---|
| *G02B 6/00* | (2006.01) | |
| *G02B 6/12* | (2006.01) | |
| *G02B 6/26* | (2006.01) | |
| *G02B 6/42* | (2006.01) | |
| *G02B 6/10* | (2006.01) | |
| *G02B 6/136* | (2006.01) | |
| *G03F 7/00* | (2006.01) | |
| *G03F 7/42* | (2006.01) | |

(52) U.S. Cl.
CPC ........... *G02B 6/136* (2013.01); *G03F 7/0005* (2013.01); *G03F 7/423* (2013.01); *G02B 2006/12138* (2013.01)

(58) Field of Classification Search
CPC .......... G02B 6/136; G02B 2006/12138; G03F 7/0005; G03F 7/423
USPC ............ 385/12–14, 30, 32, 42, 50, 129–132
See application file for complete search history.

(56) References Cited

U.S. PATENT DOCUMENTS

| | | | |
|---|---|---|---|
| 5,555,088 A | 9/1996 | Valette | |
| 10,969,548 B2 | 4/2021 | Paniccia et al. | |
| 2008/0253728 A1* | 10/2008 | Sparacin | B82Y 20/00 385/132 |
| 2011/0170825 A1* | 7/2011 | Spector | G02B 6/136 438/31 |
| 2013/0088720 A1 | 4/2013 | Sorrentino et al. | |
| 2017/0254953 A1 | 9/2017 | Ding et al. | |
| 2019/0101392 A1 | 4/2019 | Bischel et al. | |

FOREIGN PATENT DOCUMENTS

WO    2020093136 A    5/2020

OTHER PUBLICATIONS

International Search Report and Written Opinion of International Application No. PCT/US2021/50522 dated Dec. 221, 2021, 12 pages.

* cited by examiner

*Primary Examiner* — Kaveh C Kianni
*Assistant Examiner* — Hung Q Lam
(74) *Attorney, Agent, or Firm* — Lowenstein Sandler LLP; Madhumita Datta

(57) ABSTRACT

Aspects of the present disclosure are directed to process flow to fabricate a waveguide structure with a silicon nitride core having atomic-level smooth sidewalls achieved by wet etching instead of the conventional dry etching process.

14 Claims, 6 Drawing Sheets

PROCESS FLOW WITH WET ETCHING FOR SMOOTH SIDEWALLS IN SILICON NITRIDE WAVEGUIDES

RELATED APPLICATIONS

This application is related to and claims the benefit of U.S. Provisional Patent Application No. 63/078,825, filed Sep. 15, 2020, titled "Process Flow With Wet Etching For Smooth Sidewalls In Silicon Nitride Waveguides," the entirety of which is incorporated herein by reference.

TECHNICAL FIELD

The present disclosure relates to various structures and fabrication methods for integrated photonics-based optical gyroscopes utilizing silicon nitride waveguides with smooth sidewalls.

BACKGROUND

Gyroscopes (also referred to in short as "gyros") are devices that can sense angular velocity. The applications of gyroscopes include, but are not limited to, military, aircraft navigation, robotics, autonomous vehicles, virtual reality, augmented reality, gaming etc. Gyroscopes can be mechanical or optical, and can vary in precision, performance, cost and size. Since optical gyroscopes do not have any moving parts, they have advantages over mechanical gyroscopes as they can withstand effects of shock, vibration and temperature variation better than the mechanical gyroscopes with moving parts. The most common optical gyroscope is the fiber optical gyroscope (FOG) that operates based on interferometric measurements of optical phase shift due to the Sagnac effect (a phenomenon encountered in interferometry that is elicited by rotation). Construction of a FOG typically involves a coil comprising several turns of polarization-maintaining (PM) fiber. Laser light is launched into both ends of the PM fiber coil so that two optical beams travel in opposite directions. If the fiber coil is moving, the optical beams traveling in opposite directions experience different optical path lengths with respect to each other. By setting up an interferometric system, one can measure the small path length difference that is proportional to the area of the loop enclosed by the turns of the fiber coil and the angular velocity of the rotating fiber coil. This path length difference is expressed as a phase difference (referred to as "phase signal") between two counter-rotating beams.

Phase signal of an optical gyro is proportional to the Sagnac effect times the angular rotation velocity, as shown in the following equation:

$$\Delta\phi = (8\pi NA/\lambda c)\Omega$$

where, N=number of turns in the gyro,
A=area enclosed
$\Omega$=angular rotation velocity
$\Delta\phi$=optical phase difference signal
$\lambda$=wavelength of light
c=speed of light Fiber-based gyroscopes can provide very high precision, but at the same time, they are of larger footprint, are very expensive, and are hard to assemble due to the devices being built based on discrete optical components that need to be aligned precisely. Often, manual alignment is involved, which is hard to scale up for volume production.

Present inventors propose replacing fibers with waveguide based integrated photonics components for cost-effective easy integration on a semiconductor platform which is much more promising for volume production of gyroscopes. This application describes various structures including silicon nitride (SiN) waveguide cores fabricated on a silicon platform, as elaborated below. The SiN waveguide cores disclosed here can have smooth sidewalls because of wet etching instead of the conventional dry etching methods that often result in micrometer or nanometer-range sidewall roughness, that can be detrimental to optical performance of the gyroscope.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Aspects of the present disclosure are directed to process flow to fabricate a waveguide structure with a silicon nitride core having atomic-level smooth sidewalls achieved by wet etching instead of the conventional dry etching process.

More specifically, a method is disclosed where a waveguide structure is fabricated by: forming a silicon nitride (SiN) layer on top of a substrate with an oxide layer that acts as a lower cladding of the waveguide, while the SiN layer, when patterned, acts as a core of the waveguide; forming a cap layer on top of the SiN layer; patterning the cap layer by lithography and etching to form a patterned cap layer comprising a cap above the SiN layer, wherein a width of the cap is substantially equal to a target width of the core of the waveguide; and, wet etching the SiN layer beneath the patterned cap layer to create the waveguide core.

The waveguide structure can be used as rotation sensing element in an integrated photonics optical gyroscope. The rotational sensing element can be in the form of a waveguide coil. The waveguide coil can be distributed among multiple vertical layers, wherein light is coupled evanescently among the multiple vertical layers of the waveguide coil. Alternatively, the rotational sensing element is in the form of a waveguide-based microresonator ring.

Though for brevity, only the fabrication process is elaborated in this particular disclosure, Applicant incorporates by reference the earlier-filed patent application describing the single-layer and multi-layer waveguide structures for optical gyroscopes, U.S. Pat. No. 10,969,548, issued Apr. 6, 2021.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to methods of fabrication of compact ultra-low loss integrated photonics-based waveguide cores with smooth sidewalls that can be done in large scale manufacturing. These waveguides can be used as optical elements on a planar photonic integrated circuit (PIC), for example, in photonics integrated optical gyroscopes. As discussed in the background section, the key to fiber-based optical gyroscopes' high performance is the long length of high quality, low loss, optical fiber that is used to measure the Sagnac effect. The present inventors recognize that with the advent of integrated silicon photonics suitable for wafer scale processing, there is an opportunity to replace FOGs with smaller integrated photonic chip solutions without sacrificing performance. Photonics based optical gyros have reduced size, weight, power and cost, but in addition can be mass produced in high volume, are immune to vibration and have the potential to offer performances equivalent to FOGs. When integrated optical gyroscope is fabricated on a silicon platform, it is abbreviated as SiPhOG™ (Silicon Photonics Optical Gyroscope).

One key element of this integrated photonic solution is to produce very low loss waveguide core made of silicon nitride (Si$_3$N$_4$) surrounded by oxide or fused silica claddings. The whole waveguide structure (including core and cladding) is sometimes referred to as SiN waveguide for simplicity. The propagation loss in the SiN waveguides can be well below 0.1 db/meter. This is a vast improvement over the current state-of-the-art SiN process with propagation loss in the range of 0.1 db/centimeter.

Figure 1:
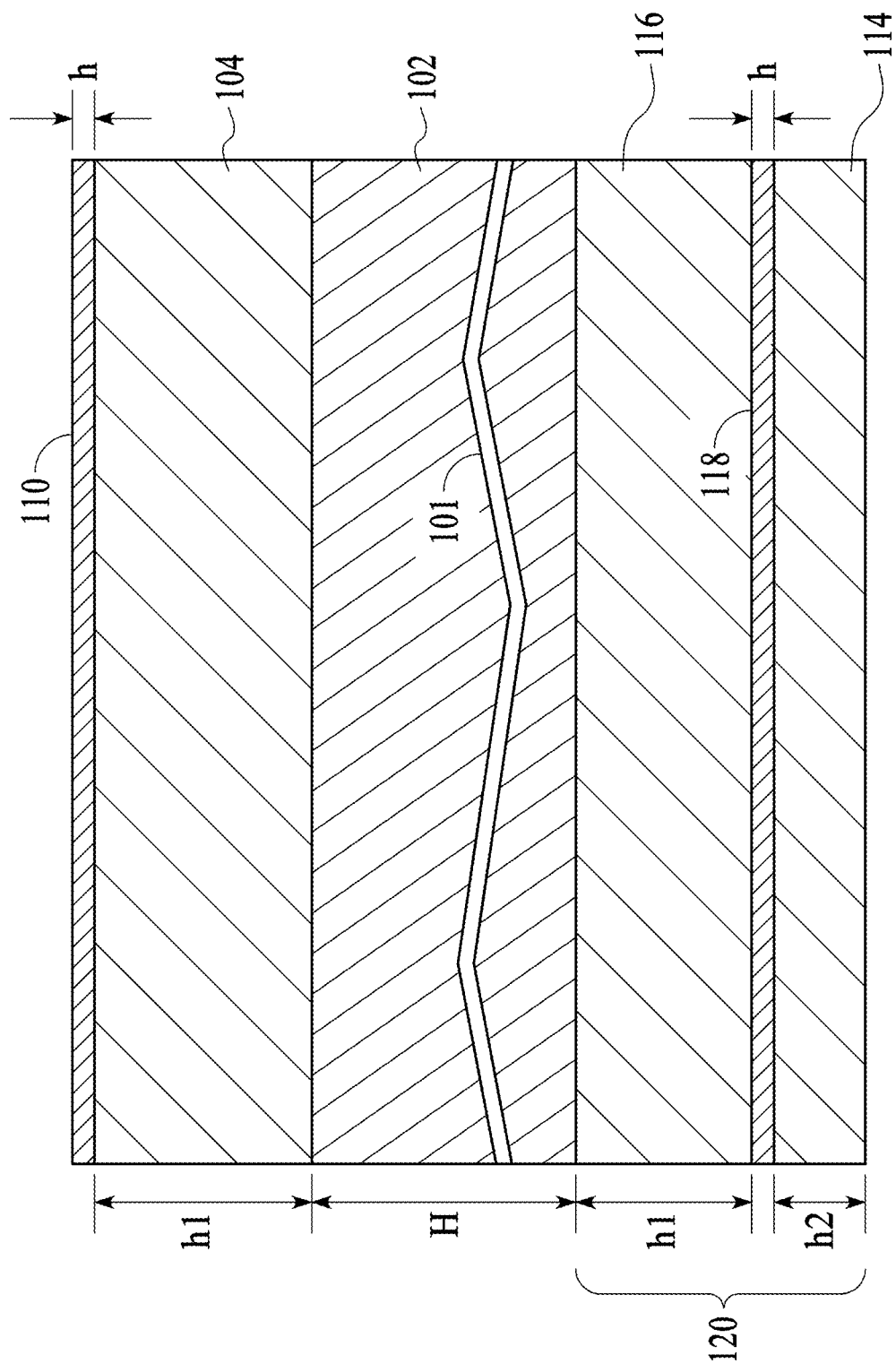
FIG. 1 is a schematic cross-sectional view showing silicon nitride (SiN) waveguide core layer deposited on oxide cladding, according to an embodiment of the present disclosure.
Figure 4:
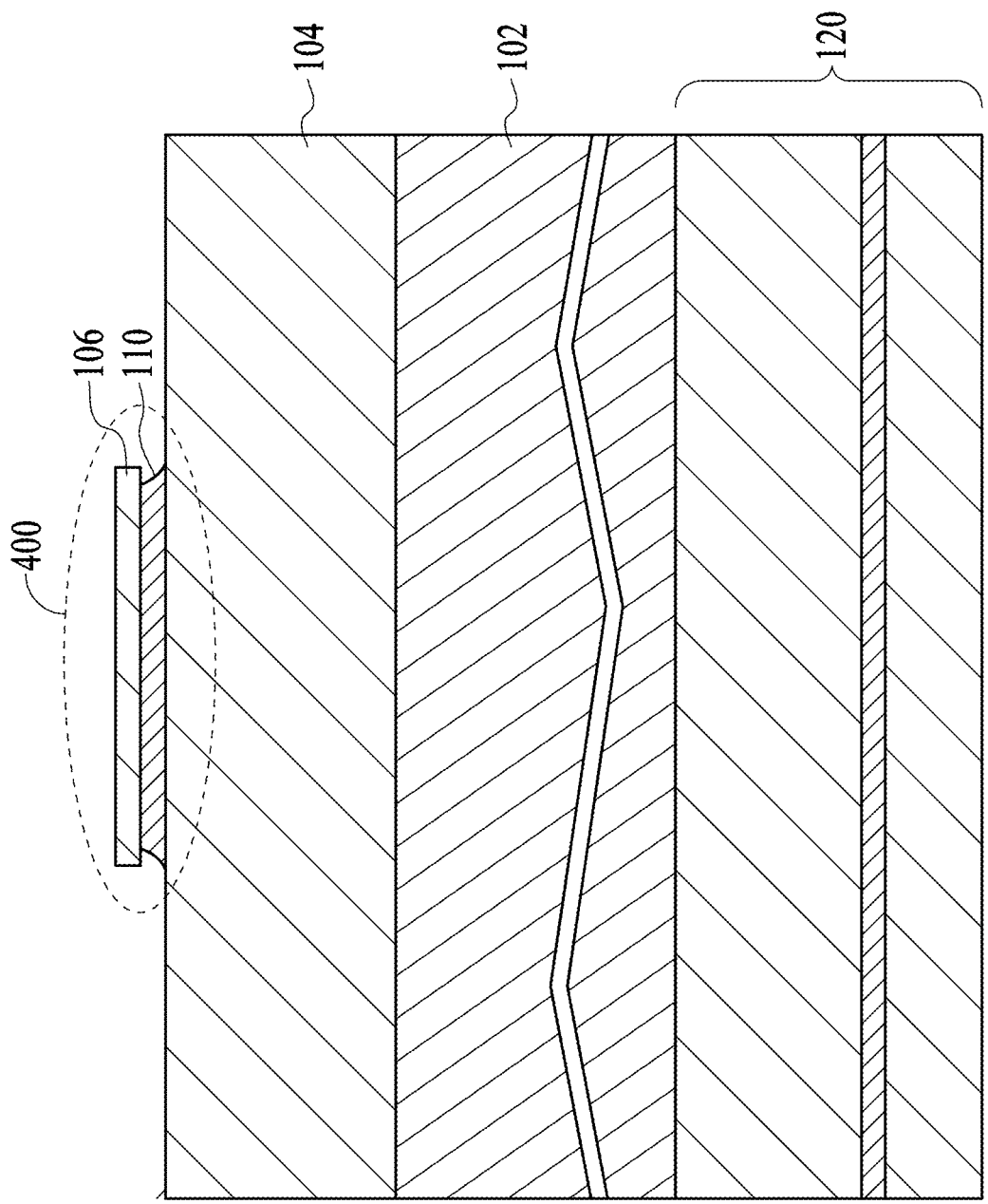
FIG. 4 is a schematic cross-sectional view showing SiN waveguide core fabricated by wet etching, according to an embodiment of the present disclosure.
Figure 5:
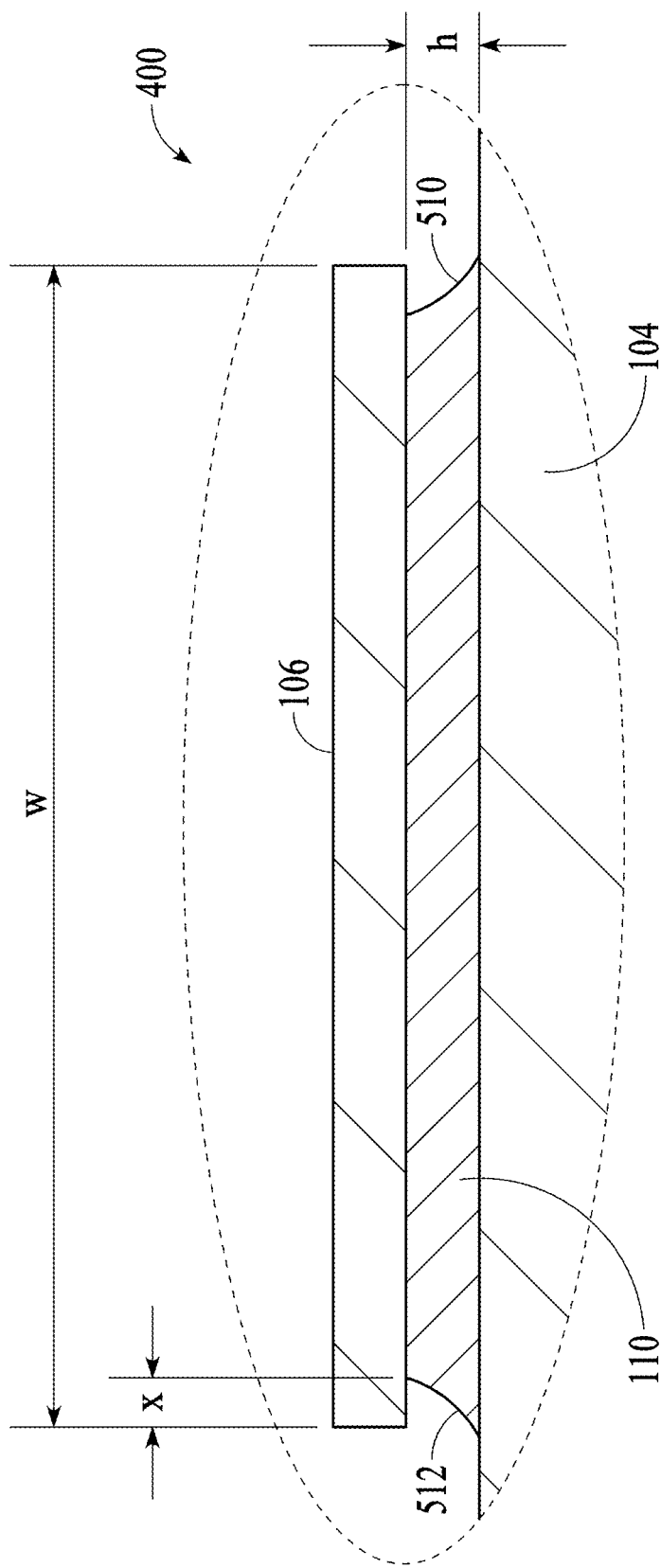
FIG. 5 is an exploded schematic cross-sectional view of the SiN waveguide core fabricated by wet etching, showing the smooth sidewalls, according to an embodiment of the present disclosure.
Figure 6:
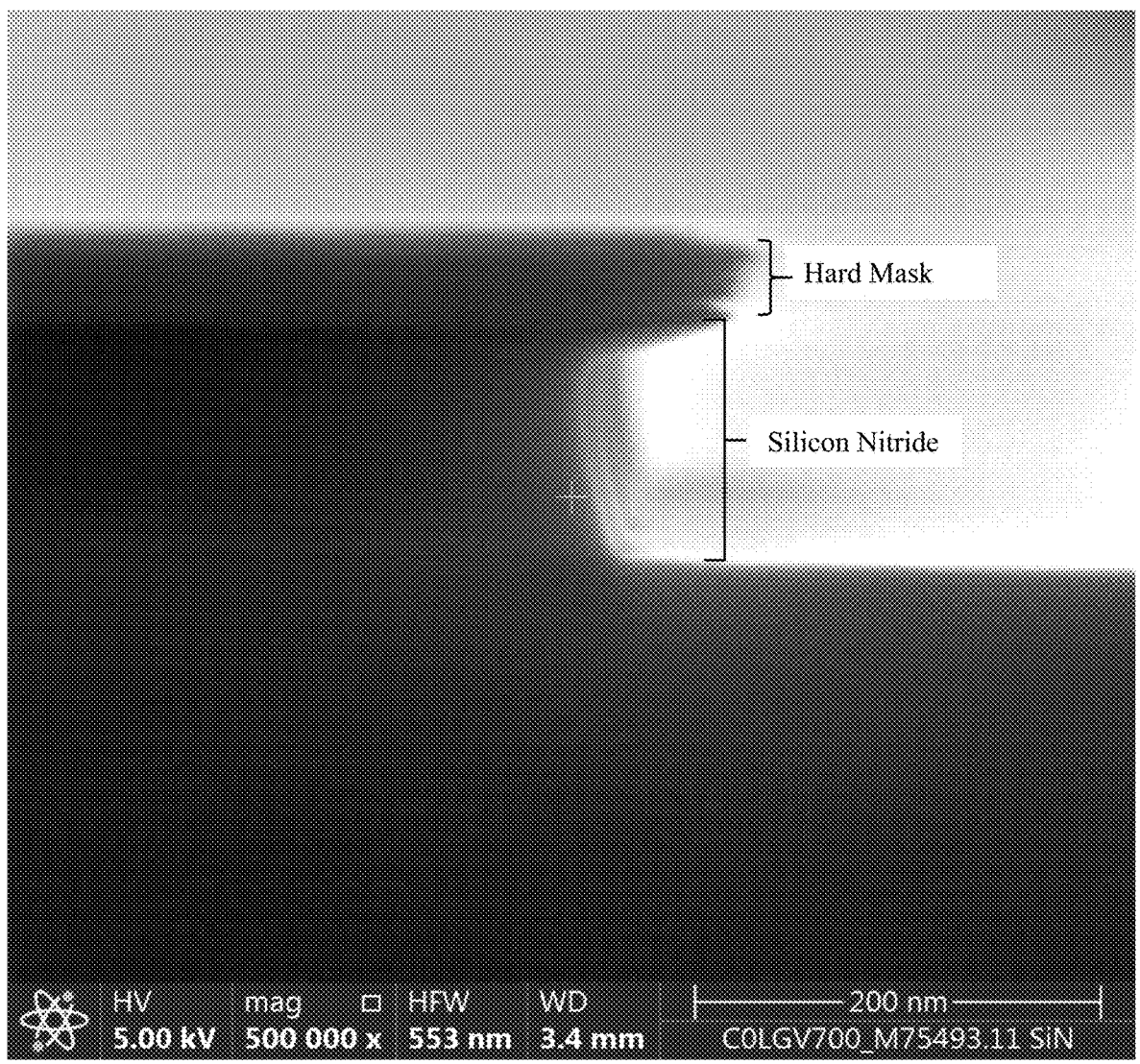
FIG. 6 is a scanning electron micrograph of the SiN waveguide core (with a hard mask on top) fabricated by wet etching, showing the smooth sidewalls, according to an embodiment of the present disclosure.

FIG. 1 shows the first step in fabricating a SiN waveguide on a conventional silicon substrate. Specifically, FIG. 1 shows a substrate 102, which may be a silicon substrate. The substrate 102 may have a thickness 'H' of a standard wafer, e.g., the thickness can be 725 um. Note that the thickness of different material layers are not drawn to scale. However, in order to convey the idea that the substrate 102 is much thicker than the rest of the material layers shown in the figures, the discontinuity 101 is introduced in the middle of the layer 102 just for visualization. The layers 104 and 116 can have a thickness 'h1' in the range of 15 um on both sides of the substrate 102. Layer 104 acts as a lower cladding for the waveguide core layer 110. Waveguide core layer 110, when patterned to the right dimension (as shown in FIGS. 4-5) can be thought of one turn of the waveguide coil. Waveguide core layer 110 can have a thickness 'h' and when patterned, a width of 'w'. Non-limiting exemplary dimensions for 'h' can be 60-100 nm, and 'w' can be 2-3 um. Waveguide core layer 110 is made of silicon nitride (SiN). Note that when layers 104 and 110 are formed on one side of substrate 102, corresponding layers 116 and 118 are also formed on the other side of the substrate 102, even though those layers may not be used for waveguiding purposes. Alternatively, those layers can create waveguides in a different layer, if necessary. An upper cladding layer 114 with thickness 'h2' in the range of 2-3 um may also be part of the structure. Both layers 114 and 116 can have the same material 120.

Figure 2:
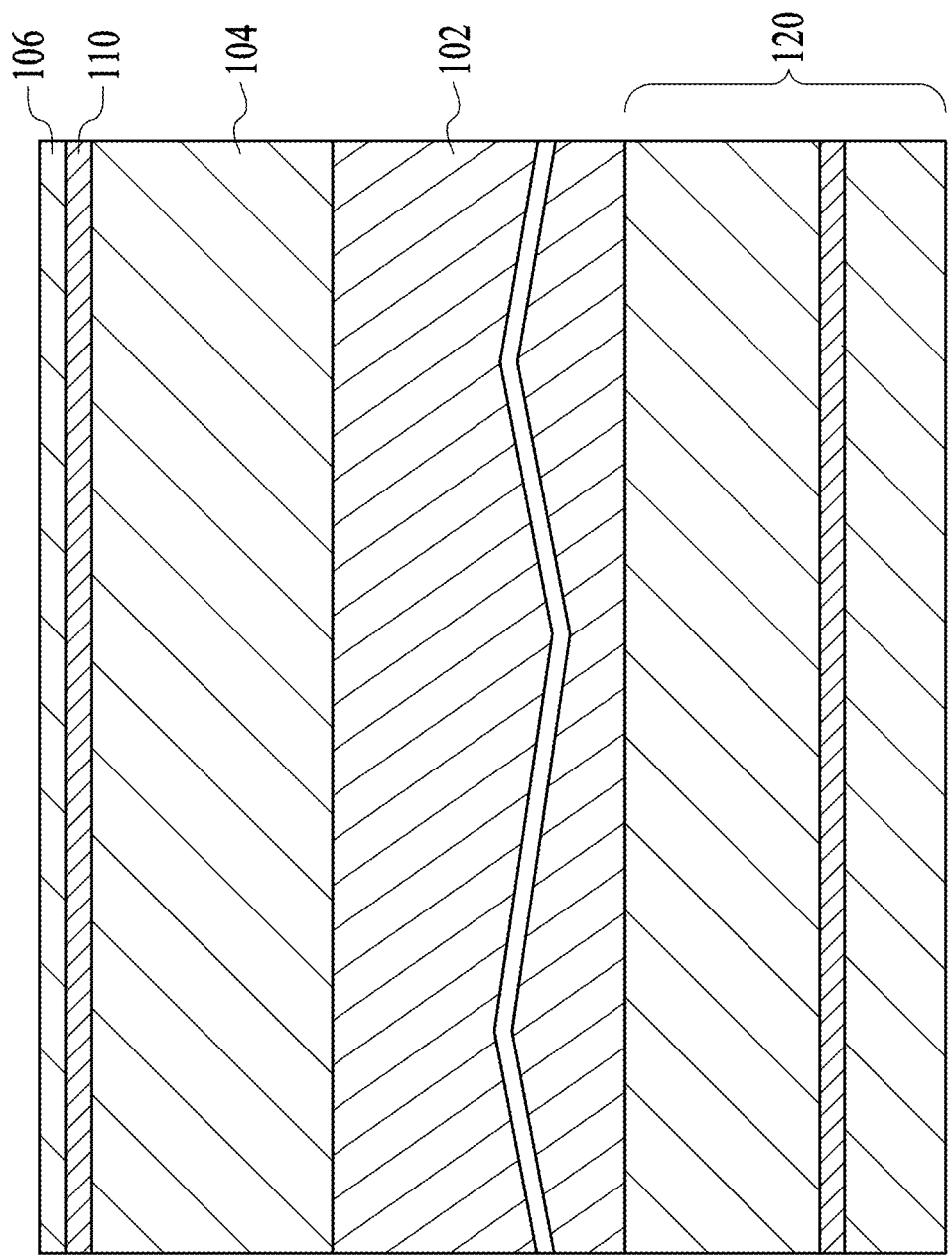
FIG. 2 is a schematic cross-sectional view showing a silicon dioxide ($SiO_2$) cap layer deposited on the SiN waveguide core layer, according to an embodiment of the present disclosure.

FIG. 2 shows the second step in fabricating a SiN waveguide core. A SiO$_2$ cap layer 106 is deposited on top of the waveguide core SiN layer 110.

Figure 3:
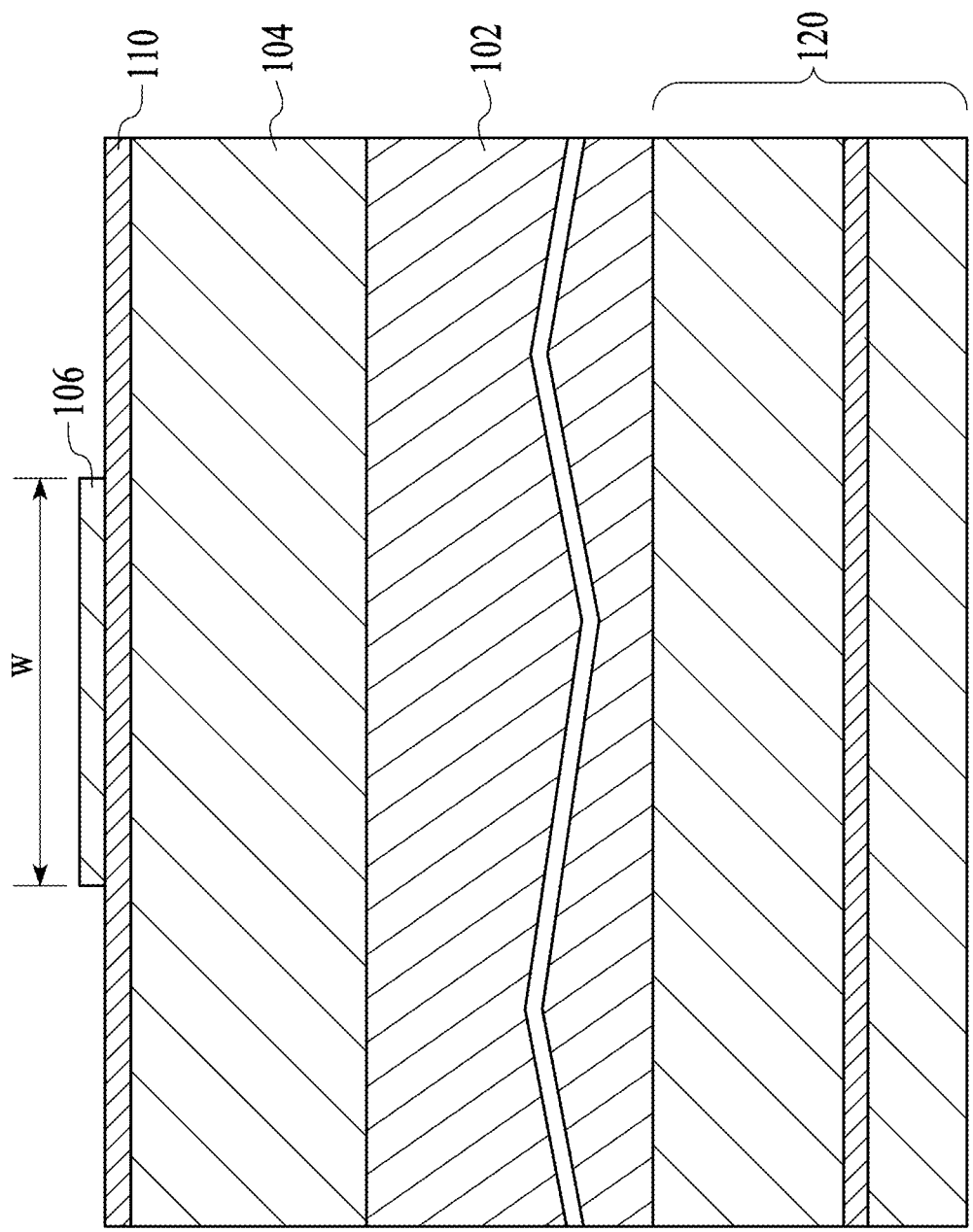
FIG. 3 is a schematic cross-sectional view showing patterning of the SiO$_2$ cap layer to appropriate width to form the SiN waveguide core, according to an embodiment of the present disclosure.

FIG. 3 shows the third step in fabricating the SiN waveguide core, where the SiO$_2$ cap layer 106 is patterned by etching to the appropriate width 'w' (e.g., 2-3 um). The SiO$_2$ cap layer acts as a hard mask. It has been experimentally seen that wet etching the hard mask followed by wet etching the SiN layer gives the best sidewall roughness, because when resist is used as mask and is dry etched, the sidewall roughness on the resist is "copied" down to the SiN layer underneath as well. In some embodiments, the cap layer can be dry etched too.

FIG. 4 shows the fourth step in fabricating the SiN waveguide core, where the waveguide core layer 110 is patterned by wet etching to the appropriate width underneath the patterned SiO$_2$ cap layer 106 with width 'w' (e.g., 2-3 um), as shown within the oval dashed outline 400. Wet etching of SiN can be done by, for example, hot phosphoric acid. The hard mask should be selectively resistant against the wet etchant.

FIG. 5 shows an exploded view of the SiN waveguide core 110 fabricated by wet etching, showing the smooth sidewalls 510 and 512. The dimension 'x' shows the recess underneath the layer 106 due to possible over-etching ('x' is typically in the range of 20-25 nm on either side). The smooth sidewalls achieved by wet etching helps reducing the optical loss during propagation within a gyroscope waveguide coil. The sidewall roughness achieved by wet etching is in atomic level, while the sidewall roughness achieved by dry etching is in the micrometer or nanometer range, i.e. much higher roughness than the atomic-level smoothness. Depending on the waveguide core lateral dimension (e.g., thickness 'h'), this smoothness can be a significant factor in dictating propagation loss and optical mode confinement, especially around waveguide bends.

After the wet etching, an upper cladding is deposited on top of the remaining hard mask above the SiN core. The remaining hard mask can act as a part of cladding and ensures that the interface between the upper cladding and the core layer has high integrity and strength to keep the optical mode tightly confined.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense. Additionally, the directional terms, e.g., "top", "bottom" etc. do not restrict the scope of the disclosure to any fixed orientation, but encompasses various permutations and combinations of orientations.

What is claimed is:

1. A method for fabricating a waveguide structure, comprising:

forming a silicon nitride (SiN) layer on top of a substrate with an oxide layer that acts as a lower cladding of the waveguide, while the SiN layer, when patterned, acts as a core of the waveguide;

forming a cap layer on top of the SiN layer;

patterning the cap layer by lithography and etching to form a patterned cap layer comprising a cap above the SiN layer, wherein a width of the cap is substantially equal to a target width of the core of the waveguide; and wet etching the SiN layer beneath the patterned cap layer to create the waveguide core, wherein the cap layer acts as a hard mask during the wet etching, and wherein selectivity between the hard mask and SiN during the wet etching controls dimension of lateral recesses underneath the cap layer that is created in the SiN layer that is patterned.

2. The method in claim 1, wherein the target width of the waveguide core is 2-3 micron.

3. The method of claim 1, wherein a material of the cap layer is silicon dioxide.

4. The method of claim 1, wherein the wet etching is performed using hot phosphoric acid.

5. The method of claim 1, wherein a sidewall roughness achieved by the wet etching is in an atomic level.

6. The method of claim 5, wherein the sidewall roughness in the atomic level is substantially less than nanometer range.

7. The method of claim 1, wherein a thickness of the SiN layer is in a range of 60-100 nm.

8. The method of claim 1, wherein the patterned cap layer acts as a part of an upper cladding of the waveguide.

9. The method of claim 8, further comprising:

depositing additional oxide layer on top of the patterned cap layer to a target thickness for the upper cladding.

10. The method of claim 1, wherein the waveguide structure is used as a rotational sensing element in an optical gyroscope.

11. The method of claim 10, wherein the rotational sensing element is in the form of a waveguide coil.

12. The method of claim 11, wherein the waveguide coil is distributed among multiple vertical layers.

13. The method of claim 12, wherein light is coupled evanescently among the multiple vertical layers of the waveguide coil.

14. The method of claim 10, wherein the rotational sensing element is in the form of a waveguide-based microresonator ring.

* * * * *